(12) United States Patent
Aoki et al.

(10) Patent No.: US 7,836,748 B2
(45) Date of Patent: Nov. 23, 2010

(54) CHAMBER SEALING VALVE

(75) Inventors: Russell S. Aoki, Tacoma, WA (US); Michael T. Crocker, Portland, OR (US); Daniel P. Carter, Bainbridge Island, WA (US)

(73) Assignee: Intel Corporation, Santa Clara, CA (US)

( * ) Notice: Subject to any disclaimer, the term of this patent is extended or adjusted under 35 U.S.C. 154(b) by 212 days.

(21) Appl. No.: 12/180,733

(22) Filed: Jul. 28, 2008

(65) Prior Publication Data

US 2008/0282775 A1 Nov. 20, 2008

Related U.S. Application Data

(62) Division of application No. 11/171,607, filed on Jun. 30, 2005, now Pat. No. 7,418,998.

(51) Int. Cl.
*G01P 21/00* (2006.01)
(52) U.S. Cl. ...................................................... 73/1.17
(58) Field of Classification Search .................... 73/1.17
See application file for complete search history.

(56) References Cited

U.S. PATENT DOCUMENTS

| 0,898,383 | A | 9/1908 | Mortimer |
|---|---|---|---|
| 1,171,610 | A | 2/1916 | Hauer |
| 1,830,132 | A | 11/1931 | Quinn |
| 2,403,777 | A | 7/1946 | Yanka |
| 2,705,501 | A | 4/1955 | Fritzsch |
| 3,572,629 | A | 3/1971 | Clark |
| 3,811,650 | A | 5/1974 | Dehar |
| 4,104,700 | A | 8/1978 | Hutchison et al. |
| 4,113,138 | A | 9/1978 | Fields et al. |
| 4,193,575 | A | 3/1980 | Burgess |
| 4,402,340 | A | 9/1983 | Lockwood, Jr. |
| 4,905,863 | A | 3/1990 | Blomquist et al. |
| 4,982,153 | A | 1/1991 | Collins et al. |
| 5,096,158 | A | 3/1992 | Burdick et al. |
| 5,184,211 | A | 2/1993 | Fox |
| 5,279,025 | A | 1/1994 | Kinast |
| 5,309,934 | A | * | 5/1994 | Jaeger ........................... 137/1 |
| 5,420,753 | A | 5/1995 | Akamatsu et al. |

(Continued)

OTHER PUBLICATIONS

Koolance-Superior liquid cooling solutions, Jul. 24, 2003.*

*Primary Examiner*—Hezron Williams
*Assistant Examiner*—Alex Devito
(74) *Attorney, Agent, or Firm*—Buckley, Maschoff & Talwalkar LLC

(57) ABSTRACT

According to some embodiments, a test fluid may be provided into a chamber associated with a cooling system for an electronic integrated circuit. Moreover, a valve may be partially inserted into an opening of the chamber to seal the chamber. The valve may include a first sealing portion to seal the chamber at the opening when the valve shaft is inserted the first distance. The valve may then be inserted an intermediate distance, between the first distance and a second distance, to unseal the chamber. Note that the valve may include a second sealing portion, offset from the first sealing portion, to seal the chamber at the opening when the valve is inserted the second distance. The valve may further define a passage, between the first and second sealing portions, to permit a flow of the test fluid when the valve is inserted the intermediate distance.

14 Claims, 13 Drawing Sheets

U.S. PATENT DOCUMENTS

| | | | |
|---|---|---|---|
| 5,427,144 A * | 6/1995 | Teets et al. ................. 251/324 |
| 5,529,115 A | 6/1996 | Paterson |
| 5,579,815 A | 12/1996 | Labonte |
| 5,609,195 A | 3/1997 | Stricklin et al. |
| 5,637,921 A | 6/1997 | Burward-Hoy |
| 6,054,676 A | 4/2000 | Wall et al. |
| 6,184,504 B1 | 2/2001 | Cardella |
| 6,962,275 B2 | 11/2005 | deCler et al. |
| 2004/0089442 A1 | 5/2004 | Goodson et al. |
| 2006/0086922 A1 | 4/2006 | Jensen et al. |

\* cited by examiner

CHAMBER SEALING VALVE

CROSS-REFERENCE TO RELATED APPLICATIONS

The present application is a divisional application of U.S. patent application Ser. No. 11/171,607, filed Jun. 30, 2005 and entitled "Cooling System Valve" (pending). The entire content of that application is incorporated herein by reference.

BACKGROUND

As processors advance in complexity and operating rate, the heat generated in processors during operation increases, and the demands on cooling systems for processors also escalate. It has been proposed to cool processors with systems that circulate a fluid proximate to a processor die. In some cases, the systems may be tested before being filled with fluid. It may be advantageous to provide an apparatus and/or method to facilitate the testing and/or filling of such systems in an efficient and cost effective manner.

DETAILED DESCRIPTION

Figure 1:
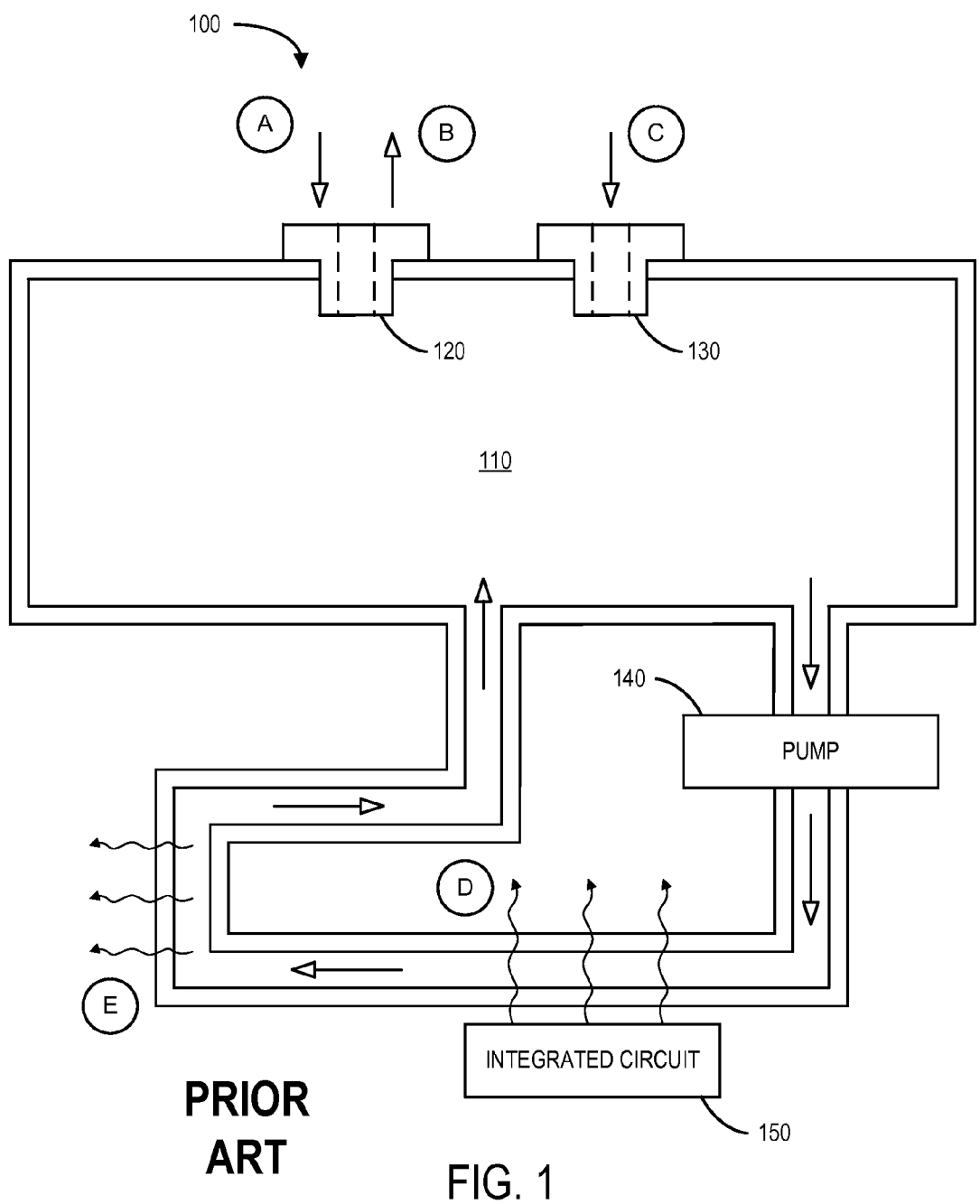
FIG. 1 is a block diagram of an integrated circuit cooling system.

An integrated circuit, such as a processor, may be cooled using a fluid cooling system. For example, FIG. 1 is a block diagram of an integrated circuit cooling system 100 that includes a fluid chamber 110. As used herein, the term "chamber" may refer to any tank, pipe, or other area to contain a fluid associated with a cooling system. Moreover, the term "fluid" may refer to any liquid or gas associated with a cooling system.

A test valve 120 and a coolant valve 130 may provide access to the chamber 110. The test valve 120 may, for example, be used to fill the chamber 110 (and the rest of the cooling system 100) with a test fluid, such as helium, at A. In some approaches, the test fluid is supplied via a hose having a seal element at its nozzle. A test may then be performed (e.g., to determine if there are any leaks in the cooling system 100).

Assuming no leaks are found, the test fluid may be evacuated from the chamber 110 at B, and the chamber 110 may be re-filled with coolant fluid at C. As before, the coolant fluid might be supplied via a hose having a seal element at its nozzle. After the chamber 110 is filled, a pump 140 may circulate the coolant fluid (e.g., out of and into the chamber 110). When the coolant fluid passes proximate to an integrated circuit 150, such as an INTEL® PENTIUM IV processor, heat generated by the integrated circuit 150 may be transferred to the coolant fluid at D. The heat from coolant fluid may then be dissipated at E (e.g., via a heat sink remote from the integrated circuit 150). In this way, the integrated circuit 150 may be cooled as it operates. Note that, as used herein, the phrase "integrated circuit" might refer to, for example, a processor, a memory unit, a memory controller hub, or some other element of a computing system.

The hoses used with the test valve 120 and/or the coolant valve 130 may require periodic servicing (e.g., to replace the sealing elements). Moreover, the coolant system 100 and/or an automated device may need to move back and forth to provide access to the test valve 120 and the coolant valve. In other cases, human interaction may be required to fill the chamber 110 with test fluid, to evacuate the test fluid from the chamber 110, and/or to fill the chamber 110 with coolant fluid. As a result, such an approach may be inefficient and expensive.

Figure 2A:
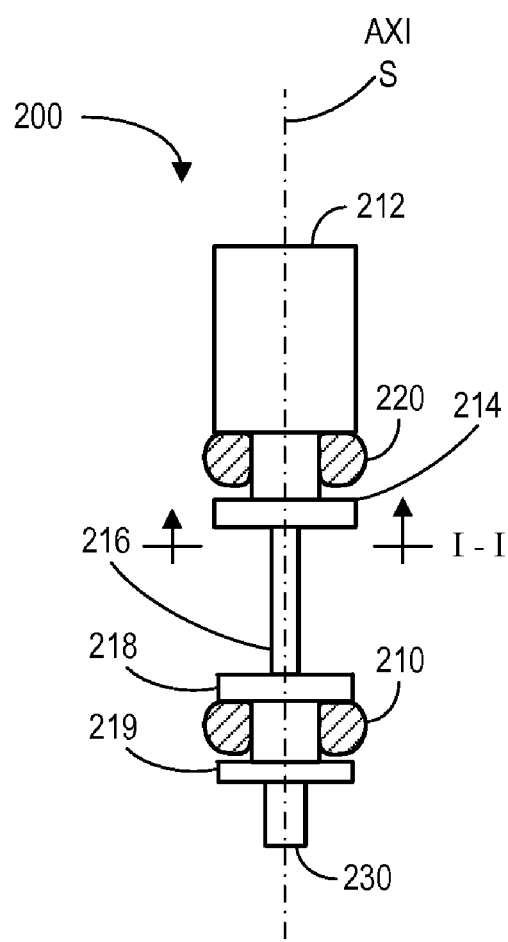
FIG. 2A is a side view of a valve according to some embodiments.

FIG. 2A is a side view of a valve 200 according to some embodiments. As used herein, the term "valve" may refer to, for example, a plug or other component that may be used to seal a chamber and/or to fill a chamber with a fluid. The valve 200 includes a valve shaft 212 which might, for example, be an injection molded component. A lower sealing portion 210 may be provided, for example, in a circular notch formed between portions 218, 219 of the shaft. Similarly, an upper sealing portion 220 may be provided in another circular notch formed between portions 212, 214. According to some embodiments, the valve shaft 212 defines an axis, and the upper sealing portion 220 is offset from the lower sealing portion 210 along that axis. Note that the sealing portions 210, 220 might be associated with, for example, an o-ring and/or an interference fit. Moreover, the sealing portion 210, 220 might have a width greater than a width of an opening they are to seal (e.g., they might compress when sealing the opening).

Figure 2B:
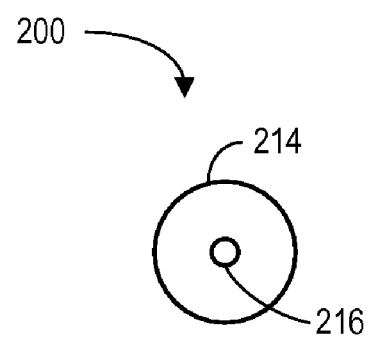
FIG. 2B is a cross-sectional view of the valve taken at line I-I of FIG. 2A according to some embodiments.

According to some embodiments, the upper sealing portion 220 has substantially the same width as the lower sealing portion 210. Moreover, a passage portion 216 of the valve shaft 212 may be provided between the lower sealing portion 210 and the upper sealing portion 220, and at least some the passage portion 216 may have a width less than the lower and upper sealing portions 210, 220. For example, FIG. 2B is a cross-sectional view of the valve 200 taken at line I-I of FIG. 2A. In this case, the entire passage portion 216 has a width less than the lower and upper sealing portions 210, 220 (as well as less than other portions 216 of the shaft 212).

According to some embodiments, the lower sealing portion 210 is adapted to seal a chamber when the valve shaft 212 is inserted into an opening a first distance along the axis, and the upper sealing portion 220 is adapted to seal the chamber when the valve shaft 212 is inserted a second distance along the axis. Moreover, the passage portion 216 may, according to some embodiments, permit a flow of fluid when the valve shaft 212 is inserted into the opening between the first and second distances.

Figure 3:
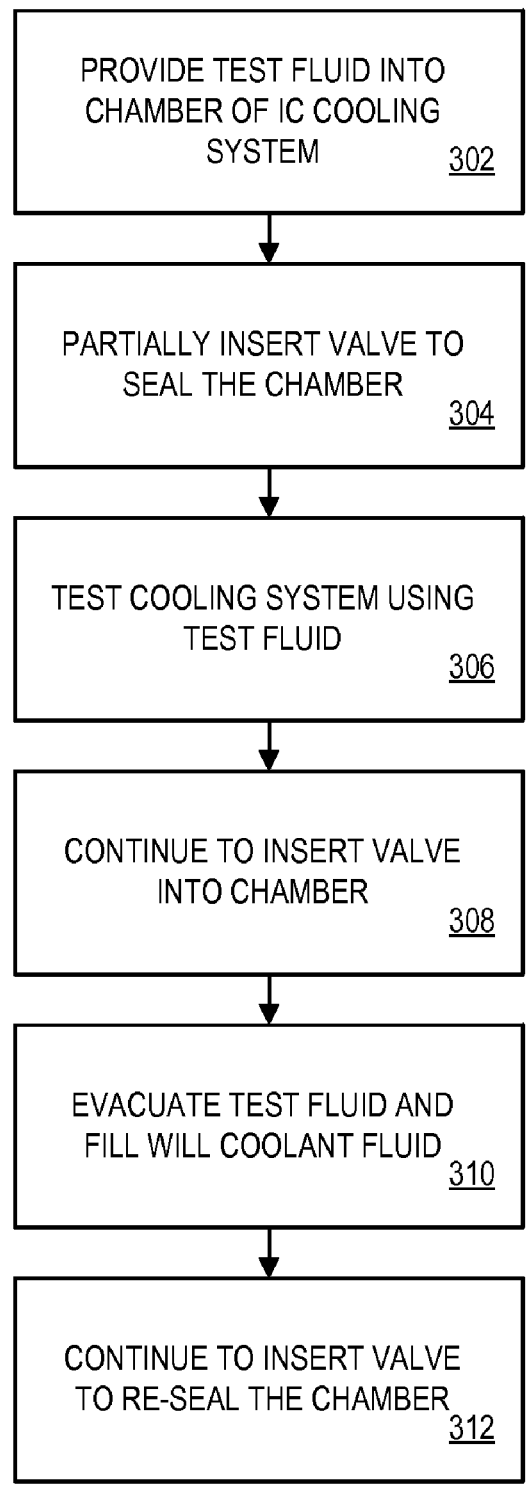
FIG. 3 is a flow chart illustrating a method according to some embodiments.

FIG. 3 is a flow chart illustrating a method according to some embodiments. The method may be performed, for example, by a cooling system assembly device. Note that any of the methods described herein may be performed by humans, hardware, software (including microcode), firmware, or any combination of these approaches. For example, a storage medium may store thereon instructions that when executed by an automated assembly machine result in performance according to any of the embodiments described herein.

Figure 4:
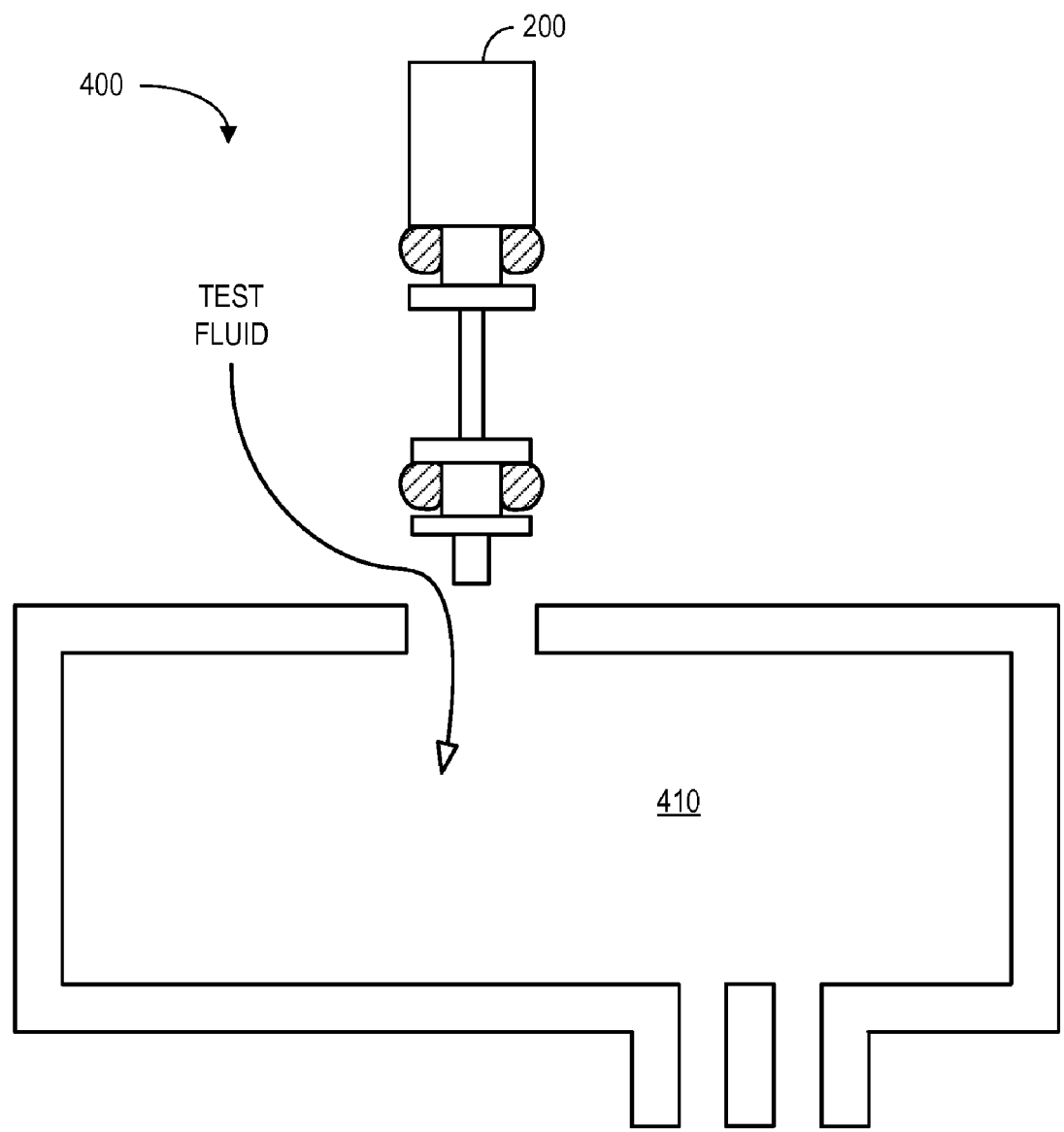
FIGS. 4-7 illustrate a valve being inserted into a chamber according to some embodiments.

At 302, a test fluid is provided into a chamber of an integrated circuit cooling system. For example, FIG. 4 illustrates the valve 200 of FIG. 2 about to be inserted into a chamber 410 according to some embodiments. The test fluid might comprise, for example, helium gas. The test fluid might be dispensed, for example, from an automated test fluid dispenser hose placed over the valve 200 and the opening into the chamber 410.

Figure 5:
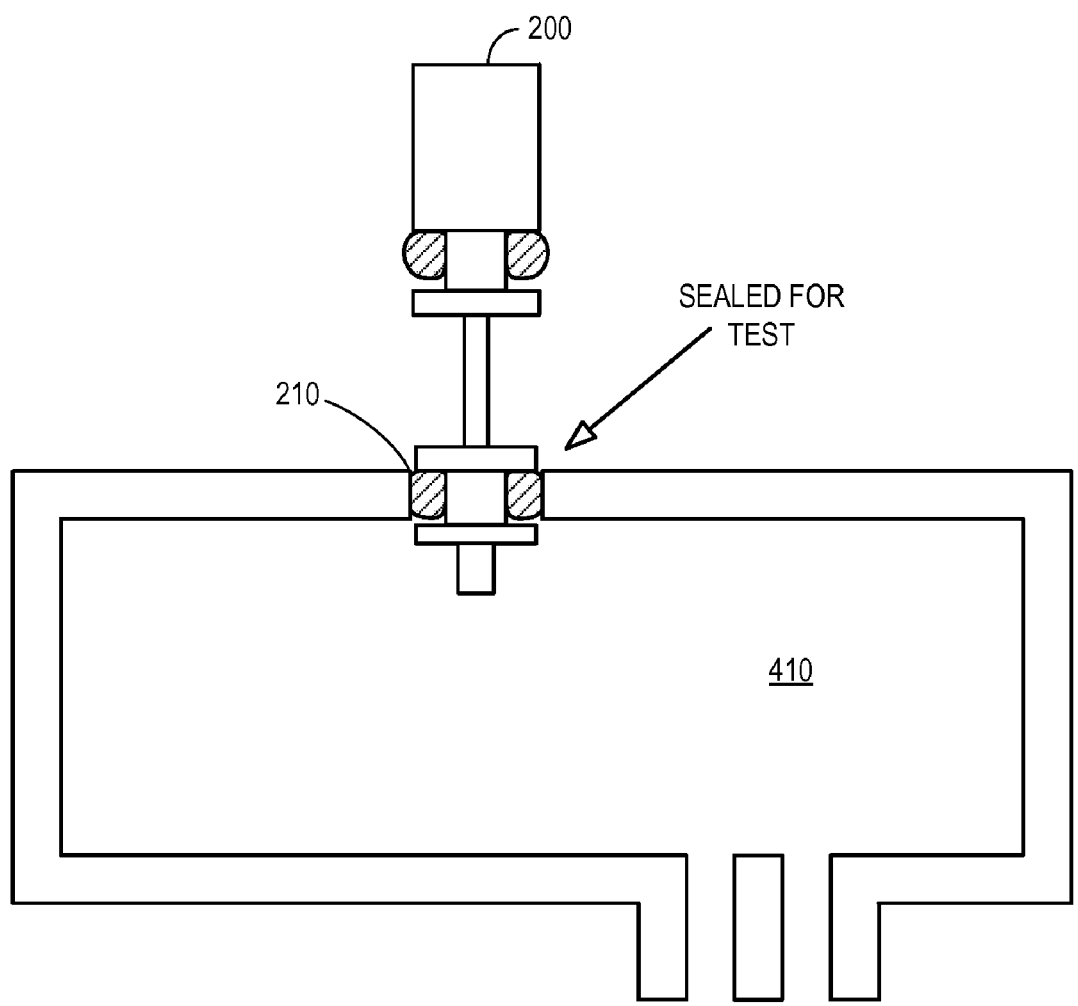

The valve may then be partially inserted into the opening of the chamber 410 at 304 to seal the chamber 410 (e.g., to keep the test fluid in the chamber). For example, FIG. 5 illustrates the valve 200 being partially inserted into the chamber 410 according to some embodiments. In this case, the lower sealing portion 210 may provide the seal that prevents the test fluid from escaping the chamber 410.

The cooling system may then be tested at 306 using the test fluid. For example, a burst test might apply 30 pounds-per-square inch (psi) of pressure. A helium detector may then determine whether or not any helium has escaped from the cooling system. If helium is detected, there may be a problem with the system and a repair of the system might be attempted or the system could simply be discarded.

Figure 6:
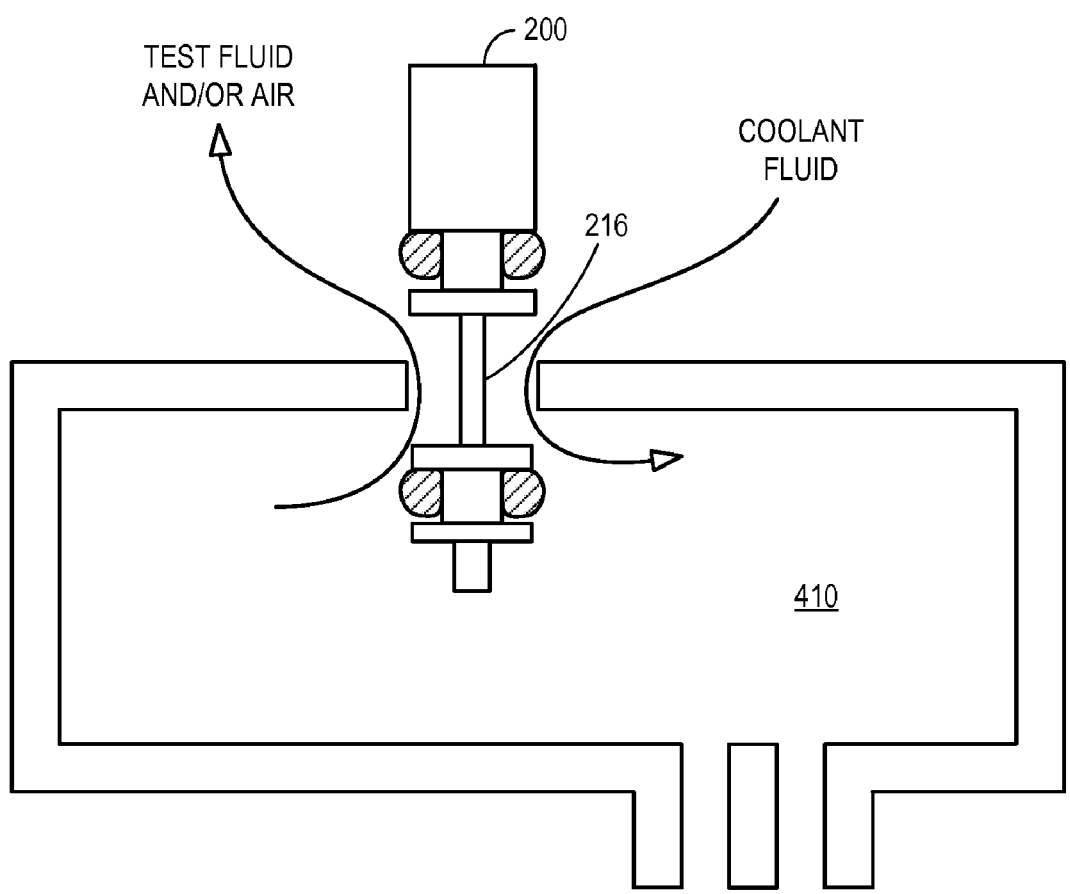

At 308, the valve is further inserted into the chamber 410. For example, FIG. 6 illustrates the valve 200 as it continues being inserted into the chamber 410 according to some embodiments. Note that the lower sealing portion is no longer sealing the chamber 410, the upper sealing portion is not yet sealing the chamber 410, and that the passage portion 216 now permits a flow of fluid out of (and into) the chamber 410.

The test fluid may now be evacuated from the chamber 410, and the chamber 410 may be filled will coolant fluid at 310. For example, a vacuum might be applied to remove helium gas (along with any remaining air) from the chamber 410. A hose from an automated coolant fluid dispenser may then be placed over the valve 200 and the opening into the chamber 410. The coolant fluid might comprise, for example, a 30% propylene glycol solution. Note that the test fluid and the coolant fluid might be different types of fluid and either might include at least one of: a gas, a liquid, air, water, helium, and/or propylene glycol.

Figure 7:
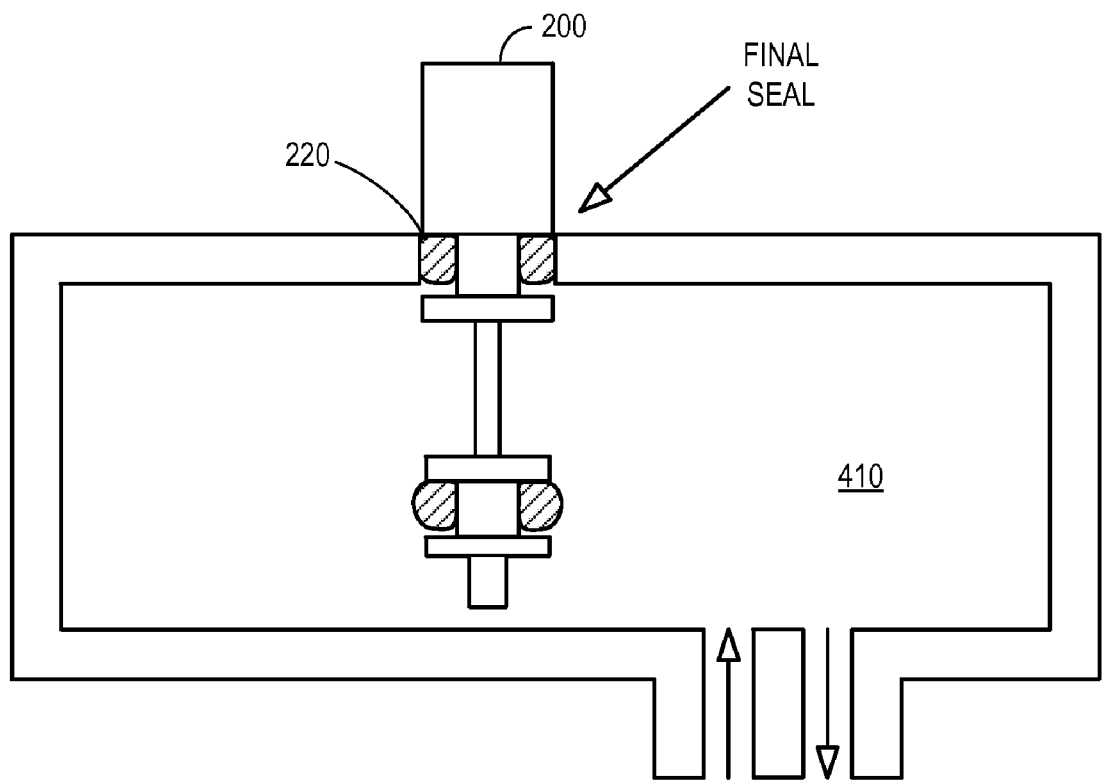

At 312, the insertion of the valve into the opening continues to reseal the chamber. For example, FIG. 7 illustrates the valve 200 after it has been fully inserted into the chamber 410 according to some embodiments. In this position, the upper sealing portion 220 may prevent coolant fluid from leaving the chamber 410. As a result, the coolant fluid may be pumped into and out of the resealed chamber 410 to cool an integrated circuit.

Note that the valve 200 may perform several different functions as it is inserted into the chamber 410 along a single axis, in a single direction (e.g., letting the chamber 410 be filled with test fluid, sealing the test fluid in the chamber 410, letting the test fluid be evacuated and re-filled with coolant fluid, and sealing the coolant fluid in the chamber 410). As a result, an apparatus and/or method may be provided to facilitate the testing and/or filling of such a cooling system in an efficient and cost effective manner. Note that, according to some embodiments, the valve 200 may be integral to the test chamber 410 (e.g., the valve might be assembled to the chamber in the open position for an initial evacuation and helium fill).

Figures 8A, 8B:
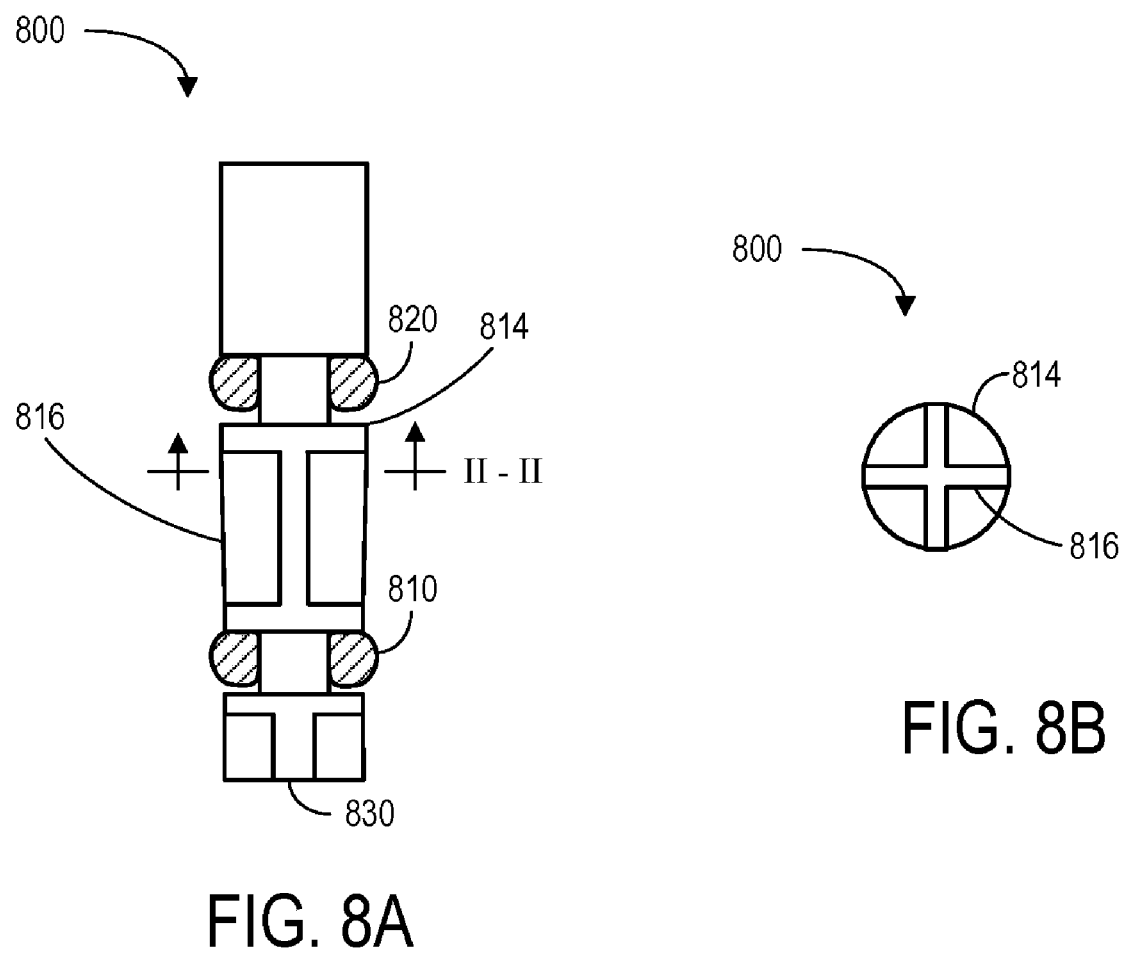
FIG. 8A is a side view of a valve according to another embodiment.
FIG. 8B is a cross-sectional view of the valve taken at line II-II of FIG. 8A according to another embodiment.

In the valve 200 described with respect to FIG. 2, the entire passage portion 216 is narrower than the sealing elements 210, 220. According to other embodiments, at least a portion of a passage portion has a width substantially equal to the width of a first and/or second sealing portion. For example, FIG. 8A is a side view of a valve 800 according to one such embodiment. The valve 800 includes a lower sealing portion 810 which may be provided, for example, in a circular notch. Similarly, an upper sealing portion 820 having substantially the same width as the lower sealing portion 810 may be provided in another circular notch. Note that the width of the lower and upper sealing portions 810, 820 may be related to the width of an opening into which the valve 800 is to be inserted.

According to this embodiment, at least some of a passage portion 816 has a width substantially equal to the lower and upper sealing portions 810, 820. For example, FIG. 8B is a cross-sectional view of the valve 800 taken at line II-II of FIG. 8A. In this case, an "X" shaped portion of the passage portion 816 has a width substantially equal to the lower and upper sealing portions 810, 820 (as well as other portions 816 of the valve 800). In this way, the passage portion 816 provides four quarter-circle shaped openings through which test fluid and coolant fluid may pass. According to some embodiments, a bottom portion 830 of the valve 800 has a similar arrangement. In this case, the test fluid may be introduced into a chamber when the valve 800 is partially inserted into an opening (e.g., before the lower sealing portion 810 engages the opening). Note that this approach might stabilize the valve 800 as it is being inserted into an opening (e.g., because the four outmost surfaces of the "X" shaped structure will engage the inside walls of the opening). Also note that the "X" shaped structure is provided only as an example, and many other arrangements might be provided (e.g., a "Y" shaped structure might be provided instead).

Figure 9:
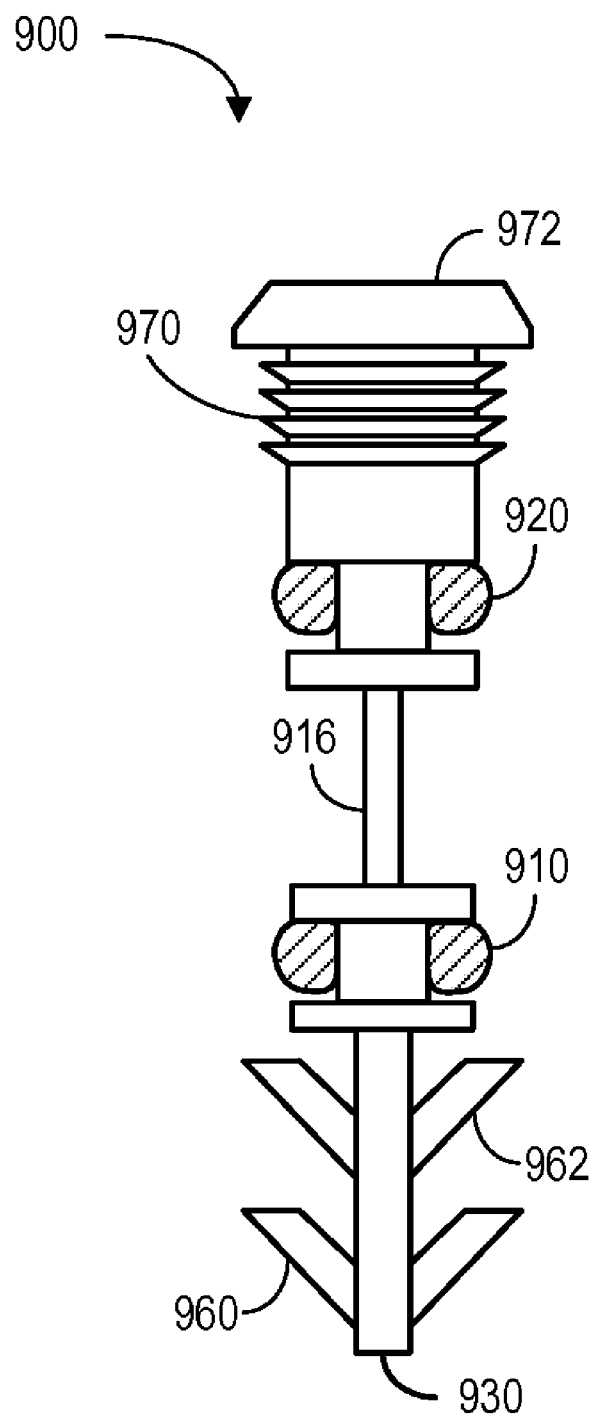
FIG. 9 is a side view of a valve according to another embodiment.

FIG. 9 is a side view of a valve 900 according to another embodiment. As before, the valve 900 has passage portion 916 between a lower o-ring 910 and an upper o-ring 920. In this case, a lower set of cantilever portions 960 and an upper set of cantilever portions 962 are provided near an insertion end 930 of the valve. In addition, ridges or barbs 970 may be provided near the top of the valve 900 along with a valve cap 972.

Figure 10:
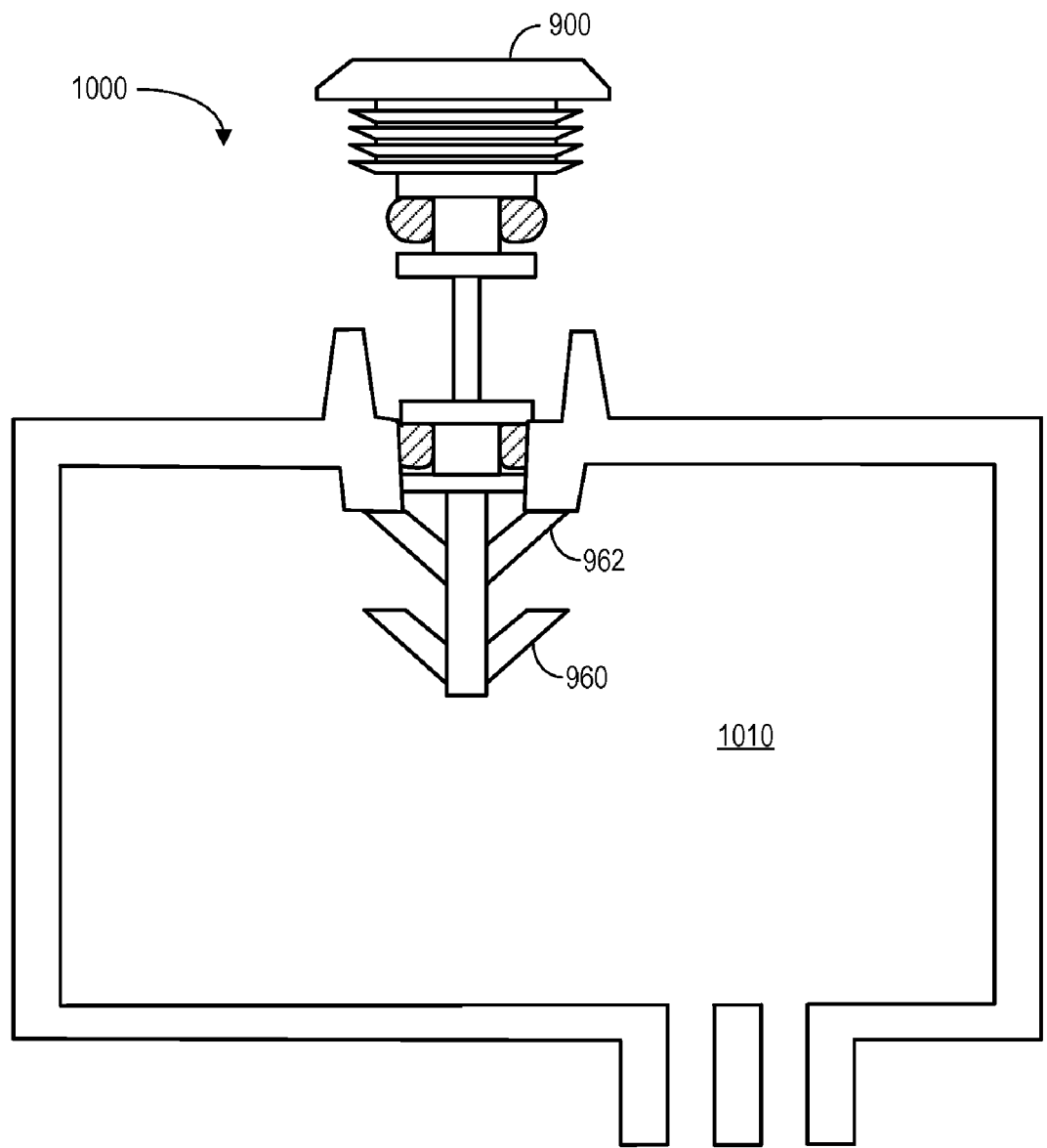
FIG. 10 illustrates a cantilever portion holding a valve in place during a test procedure according to some embodiments.

The cantilever portions 960, 962 may, for example, be adapted to brace the valve 900 when the valve is partially inserted into an opening. For example, FIG. 10 illustrates how the upper cantilever portions 962 might hold the valve 900 in place during a burst test according to some embodiments. Also note that the cantilever portions 960, 962 might flex, bend, or pivot inward toward the center axis of the valve 900 when passing through the opening of a chamber 1010. Also note that the lower cantilever portions 960 might, for example, hold the valve in place during another action of a test and/or filling process (e.g., when test fluid is provided into the chamber 1010).

Figure 11:
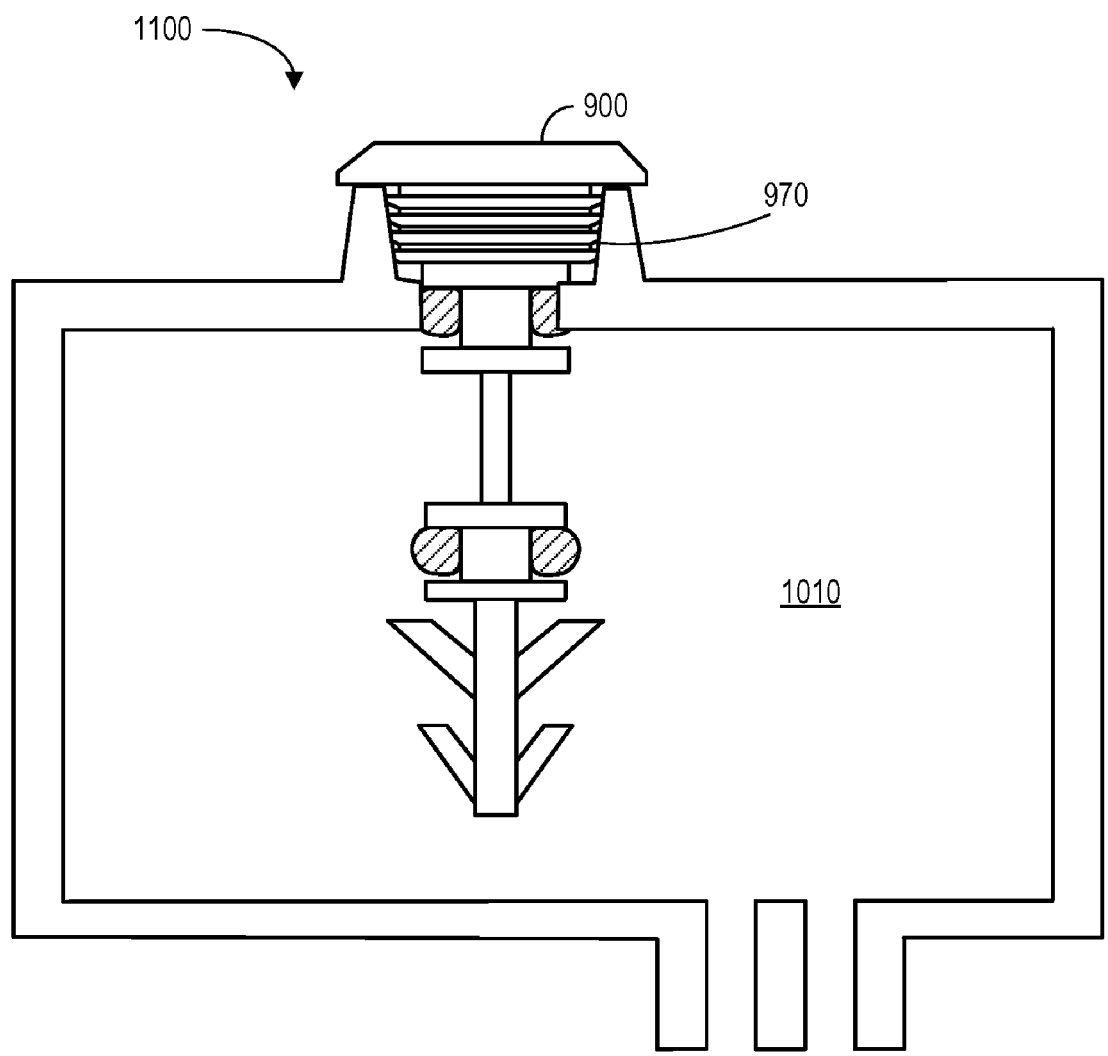
FIG. 11 illustrates barbs holding a valve in place according to some embodiments.

The barbs 970 might, for example, be plastic elements adapted to hold the valve 900 when the valve 900 is completely inserted into an opening. For example, FIG. 11 illustrates barbs 970 holding the valve 900 in place according to some embodiments. The barbs 970 might have, for example, edges that "bite" into the walls of the opening to form a cold weld that completely and permanently seals the chamber 1010.

Figure 12:
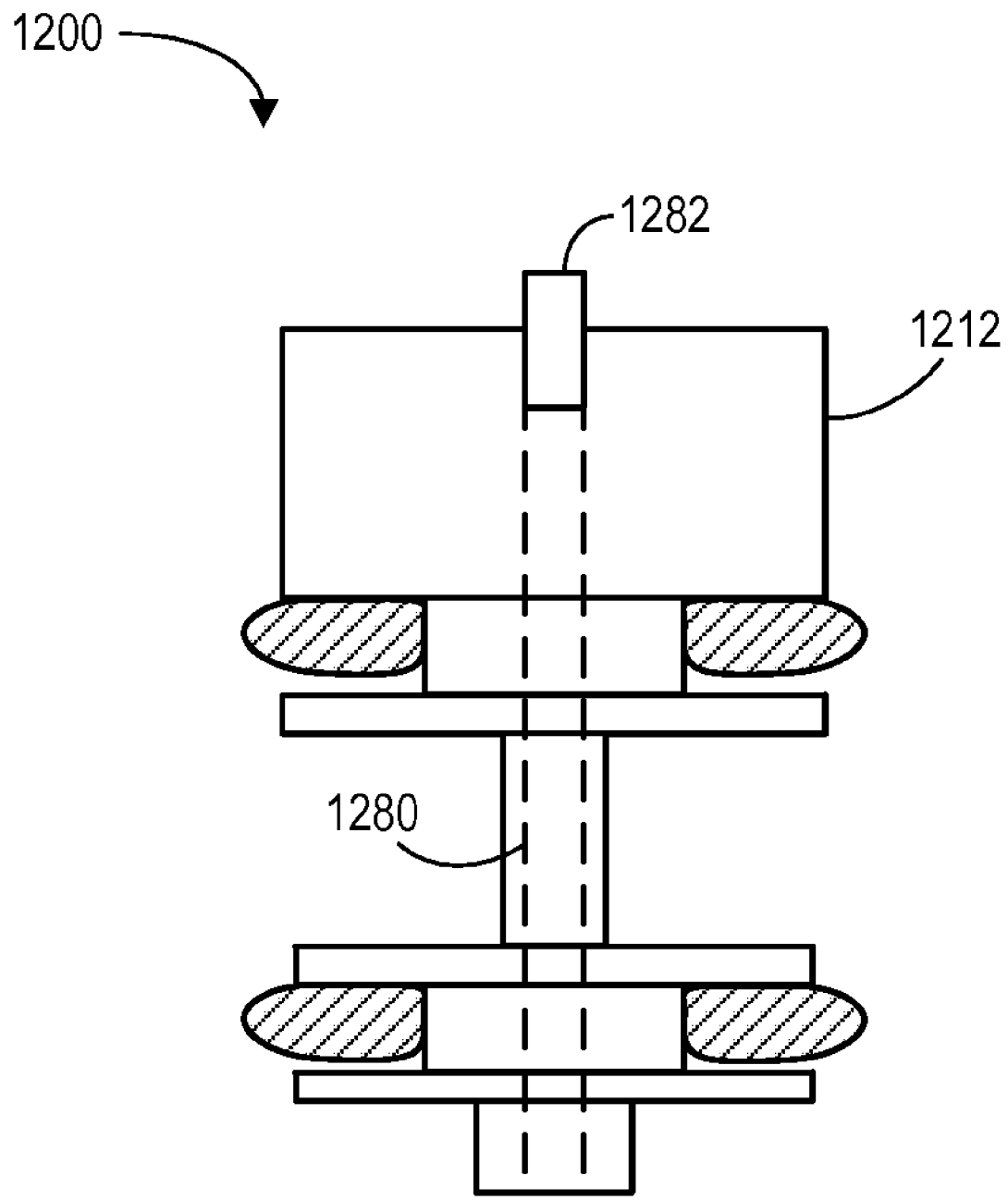
FIG. 12 is a valve according to another embodiment.

According to other embodiments, a chamber might not be permanently sealed after being filled with coolant fluid. For example, FIG. 12 is a valve 1200 according to another embodiment. In this case, a tube 1280 is formed extending from the top of the valve 1200 to the bottom of the valve 1200. Moreover, a removable plug 1282 might be provided near the top of the tube 1280 to provide access into a chamber after the valve 1200 is inserted into an opening. The plug 1282 might, for example, be screwed into the tube 1280.

Figure 13:
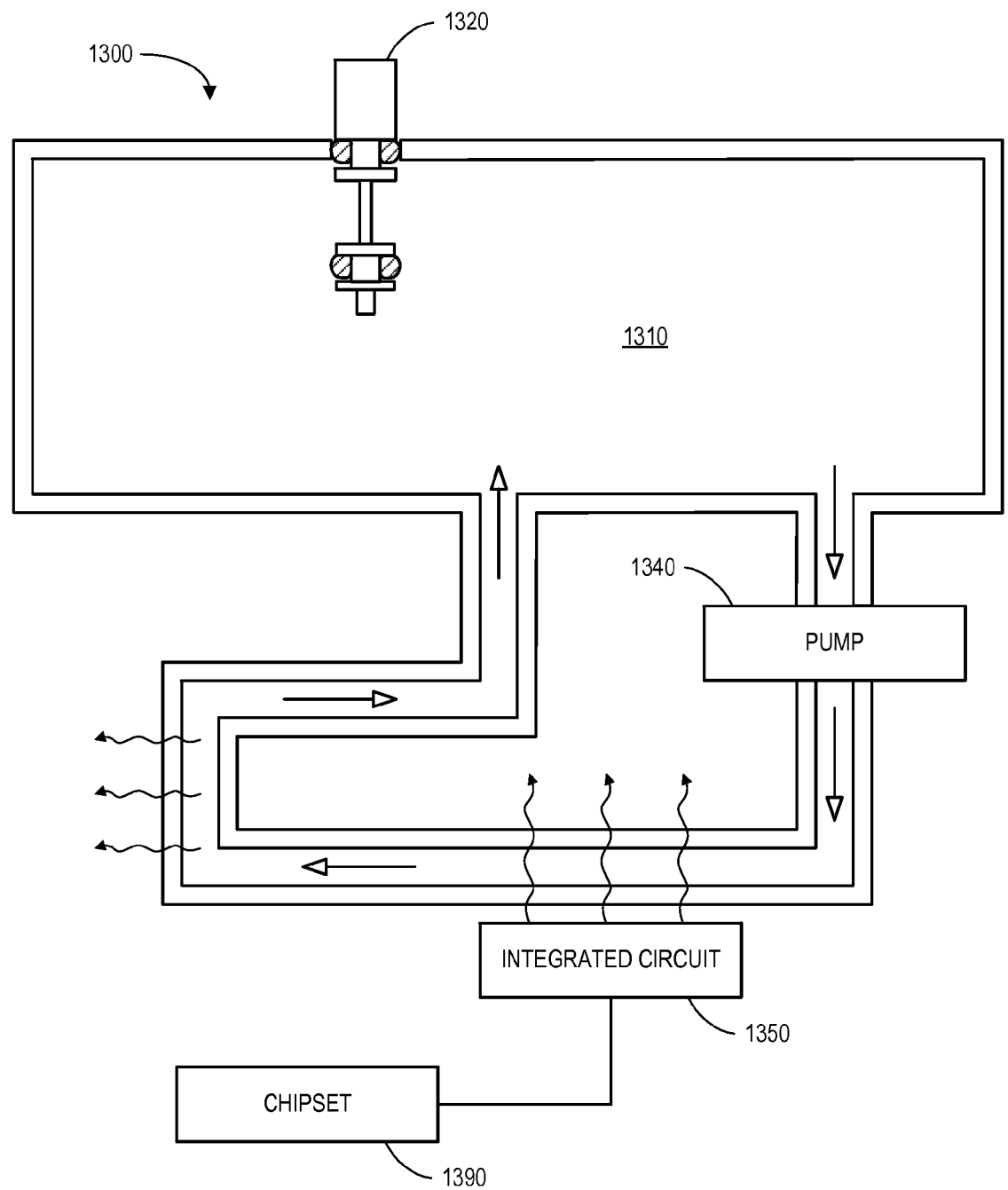
FIG. 13 illustrates a system according to some embodiments.

FIG. 13 illustrates a system 1300 that may be used to cool an integrated circuit 1350, such as a processor, according to some embodiments. The system 1300 might be associated with, for example, a Personal Computer (PC), a mobile computer, a server, a media device, and/or a game device.

The system 1300 includes a chamber 1310 tested, filled, and/or sealed using a valve 1320 according to any of the embodiments described herein. For example, the valve 1320 might include a first sealing portion adapted to seal the chamber 1310 when the valve 1320 is inserted a first distance into an opening of the chamber 1310 and a second sealing portion adapted to seal the chamber 1310 when the valve 1320 is inserted a second distance. According to some embodiments, the system 1300 further includes a chipset 1390 to communicate with, and facilitate operation of, the integrated circuit 1350.

The following illustrates various additional embodiments. These do not constitute a definition of all possible embodiments, and those skilled in the art will understand that many other embodiments are possible. Further, although the following embodiments are briefly described for clarity, those skilled in the art will understand how to make any changes, if necessary, to the above description to accommodate these and other embodiments and applications.

For example, although particular shapes have been described for valves herein, embodiments may have any number of different shapes (e.g., a valve might have a rectangular cross section). Similarly, although valves have been illustrated as being vertically inserted into chambers, note that a valve could be inserted along any other axis (e.g., a valve might be horizontally inserted into a chamber). Moreover, although particular configurations of elements have been described, note that a valve might include any combination of the elements described herein (e.g., a valve might have cantilever portions but no barbs).

In addition, embodiments have been described herein as being associated with integrated circuit cooling systems. Note, however, that any embodiments could be associated with other types of cooling systems. For example, a plastic valve as described herein might be used to seal a liquid cooling system associated with a laser diode. Moreover, any embodiments might be associated with systems other than cooling systems. For example, a valve as described herein might be used to seal any chamber that is to be filled and re-filled with a fluid, such as one associated with a hydraulic brake system.

The several embodiments described herein are solely for the purpose of illustration. Persons skilled in the art will recognize from this description other embodiments may be practiced with modifications and alterations limited only by the claims.

What is claimed is:

1. A method, comprising:
providing a test fluid into a chamber associated with a cooling system for an electronic integrated circuit;
partially inserting a valve a first distance into an opening of the chamber to seal the opening of the chamber, the opening having a width, wherein said valve defines an axis along which the valve is inserted into the opening, and further wherein said valve includes a first sealing portion to seal the opening of the chamber when the valve is inserted the first distance;
continuing to insert the valve an intermediate distance, between the first distance and a second distance, to unseal the chamber, wherein said valve includes a second sealing portion on the valve, offset from the first sealing portion along the axis, to seal the chamber at the opening when the valve is inserted the second distance, and further wherein said valve defines a passage between the first and second sealing portions, at least some the passage having a width less than the first and second sealing portions to permit a flow of the test fluid when the valve is inserted the intermediate distance;
evacuating the test fluid from the unsealed chamber while the valve is inserted the intermediate distance;
filling the unsealed chamber with a coolant fluid while the valve is inserted the intermediate distance; and
continuing to insert the valve from the intermediate distance to the second distance to reseal the opening of the chamber with the second portion of said valve.

2. The method of claim 1, further comprising after the partially inserting and before the continuing to insert:
testing the cooling system using the test fluid.

3. The method of claim 2, wherein the testing is associated with a pressurized leak test.

4. The method of claim 1, further comprising:
pumping the coolant fluid into and out of the resealed chamber to cool the electronic integrated circuit.

5. The method of claim 4, further comprising:
facilitating a removal of heat from the coolant fluid with a heat exchanger.

6. The method of claim 1, wherein at least one of the test fluid or the coolant fluid includes at least one of: (i) a gas, (ii) a liquid, (iii) air, (iv) water, (v) helium, or (vi) propylene glycol.

7. The method of claim 1, wherein the test fluid and the coolant fluid are different types of fluid.

8. The method of claim 1, wherein the electronic integrated circuit comprises a processor.

9. The method of claim 7, wherein processor is associated with at least one of: (i) a personal computer, (ii) a mobile computer, (iii) a server, (iv) a media device, or (v) a game device.

10. The method of claim 1, wherein at least one of the first and second sealing portions comprise at least one of: (i) an o-ring or (ii) an interference fit.

11. The method of claim 10, wherein the o-ring sits within a circular notch of the valve .

12. The method of claim 1, further comprising:
using a cantilever portion, proximate to an end of the valve to be inserted into the opening, to brace the valve when the valve is inserted into the opening.

13. The method of claim 1, further comprising:
using at least one barb to hold the valve when the valve is inserted into the opening.

14. The method of claim 1, further comprising:
using a removable plug to access the chamber when the valve is inserted into the opening.

* * * * *